(12) United States Patent
Lee

(10) Patent No.: US 7,015,591 B2
(45) Date of Patent: Mar. 21, 2006

(54) EXPOSED PAD MODULE INTEGRATING A PASSIVE DEVICE THEREIN

(75) Inventor: Chien-Chen Lee, Zhubei (TW)

(73) Assignee: Airoha Technology Corp., Hsinchu (TW)

(*) Notice: Subject to any disclaimer, the term of this patent is extended or adjusted under 35 U.S.C. 154(b) by 0 days.

(21) Appl. No.: 10/922,422

(22) Filed: Aug. 20, 2004

(65) Prior Publication Data
US 2005/0224937 A1    Oct. 13, 2005

(30) Foreign Application Priority Data
Apr. 9, 2004  (TW) ............................... 93110034 A

(51) Int. Cl.
*H01L 23/52* (2006.01)
*H01L 23/34* (2006.01)

(52) U.S. Cl. ...................... 257/786; 257/724; 257/723; 257/787; 257/924

(58) Field of Classification Search ................ 257/786, 257/723, 724, 693, 737, 738, 924
See application file for complete search history.

(56) References Cited

U.S. PATENT DOCUMENTS 6,548,328 B1 * 4/2003 Sakamoto et al. .......... 438/121
6,849,931 B1 * 2/2005 Nakae ........................ 257/672

* cited by examiner

*Primary Examiner*—Jasmine Clark
(74) *Attorney, Agent, or Firm*—Thomas, Kayden, Horstemeyer & Risley

(57) ABSTRACT

An exposed pad module integrated a passive device therein. The module includes a base, an active device overlying the base, a trace line electrically connecting to the active device, beyond the base, a pad beyond the trace line, a passive device electrically connecting the trace line and contact pad, and an encapsulant covering the active device, trace line, and passive device, and exposing the active device base and at least a part of the pad.

21 Claims, 5 Drawing Sheets

EXPOSED PAD MODULE INTEGRATING A PASSIVE DEVICE THEREIN

BACKGROUND

The invention relates to a package structure, and in particular to an exposed pad module integrating a passive device therein.

Due to the demand for high-frequency, high-speed system-in-package (SIP), small-aspect package design capable of effective heat dissipation and excellent electrical performance is necessary. Thus, package technology is a critical issue in SIP design. QFN (quad flat no-lead), capable of low pin inductance, is a widely anticipated technology, which utilizes a lead frame as a substrate.

A lead frame for QFN has a die paddle, attaching a chip thereto, and a plurality of leads beyond the die paddle. The chip has a plurality of terminals respectively electrically connecting the corresponding leads. An encapsulant covers the chip and respectively exposes the ends of the leads. The lead ends and the encapsulant are approximately coplanar, achieving a QFN package.

A QFN-package has smaller aspect and better electrical performance than other package types. In a printed circuit board assembly (PBCA) process, QFN packages and passive devices are individually disposed on a PCB, resulting in the necessity to design PCB wirings to electrically connect corresponding QFN packages and passive devices. The required wirings may enlarge the PCB and/or wiring density thereof. Denser PCB wirings may cause crosstalk therebetween.

SUMMARY

Thus, embodiments of the invention provide an exposed pad module, with reduced wiring density and PCB aspect, thereby reducing the overall size of an end product using the module, and improving the electrical performance thereof.

Embodiments of the invention provides an exposed pad module, comprising a base, an active device overlying the base, a trace line beyond the base, a pad beyond the trace line, a passive device electrically connecting the trace line and contact pad, and an encapsulant covering the active device, trace line, and passive device, and exposing the active device base and at least a part of the pad. The trace line electrically connects the active device.

Embodiments of the invention further provides an exposed pad module, comprising a base, an active device overlying the base, a trace line beyond the base, a conductor electrically connecting the active device and trace line, a pad beyond the trace line, a SMT passive device electrically connecting the trace line and pad, a patterned solder mask overlying the trace line and pad, a first encapsulant covering the active device, trace line and passive device, and a second encapsulant covering the trace line and passive device, exposing the base and at least a part of the pad. The trace line is thinner than the base. The pad is approximately as thick as the base. The SMT passive device is between the trace line and pad. The first encapsulant is above the base. The second encapsulant is beneath the trace line and passive device.

BRIEF DESCRIPTION OF THE DRAWINGS

The invention can be more fully understood by reading the subsequent detailed description in conjunction with the examples and references made to the accompanying drawings, wherein.

DETAILED DESCRIPTION

The following embodiments are intended to illustrate the invention more fully without limiting the scope of the claims, since numerous modifications and variations will be apparent to those skilled in this art.

Figure 1:
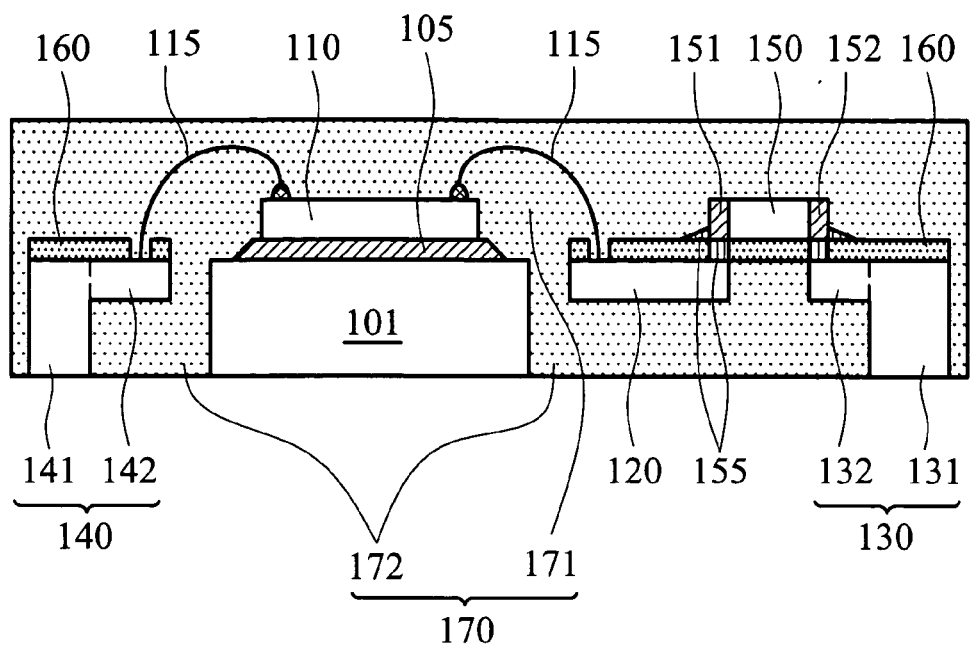
FIG. 1 is a cross-section of an exposed pad module of a first embodiment of the invention.

In FIG. 1, a cross-section of an exposed pad module of one embodiment of the invention is shown. An active device 110, such as a semiconductor chip, photoelectric-device, or other device, is disposed overlying an exposed base 101. In this embodiment, the active device 100 is a semiconductor chip. A trace line 120 is beyond the base and electrically connects the active device 110.

In this embodiment, the electrical connection between the active device 110 and trace line 120 is achieved by a conductor 115, such as a gold wire or aluminum wire, connecting therebetween. A glue layer 105, such as a thermosetting epoxy, is preferably disposed between the base 101 and active device 110 to fix the active device 110 thereto.

A pad 130 is beyond the trace line 120. The pad 130 can have a body 131 and extension 132 extending from the body 131 beyond the trace line 120. A passive device 150 preferably has terminals 151 and 152 respectively electrically connecting the trace line 120 and pad 130. Thus, the active device 110, conductor 115, trace line 120, passive device 150, and pad 130 are electrically connected. Further, the passive device 150 may be disposed between the trace line 120 and pad 130. When the pad 130 comprises the body 131 and extension 132, the terminal 152 electrically connects to the extension 132, and the passive device 150 may be disposed between the trace line 120 and extension 132. The passive device 150 is preferably a SMT (surface mount technology) device, thus solder 155 can act as a glue layer respectively disposed on the trace line 120 and pad 130, followed by disposition of the passive device 150 respectively on the trace line 120 and pad 130, achieving the electrical connection to the trace line 120 and pad 130. A patterned solder mask 160 may be disposed overlying the trace line 120 and pad 130, exposing contact areas for connection to the passive device 150 and conductor 115 as desired. The exposed contact areas for connection to the passive device 150 can further limit the position of solder 155 when disposing the passive device 150.

Further, the pad 102, trace line 120, pad 130 are preferably copper and may be coated to prevent corrosion and/or facilitate soldering. A Ni/Au layer is a preferred coating layer.

An encapsulant 170, covering the active device 110, trace line 120, and passive device 150, is preferably a mixture having thermosetting epoxy and silica fillers. When the active device is or has a photoelectric device, the encapsulant 170 may be a transparent glass and/or thermosetting resin. The trace line 120 is preferably thinner than base 101 to simplify the encapsulation thereof. Further, the encapsulant 170 exposes the base 101 and at least a part of the pad 130. When the pad 130 comprises the body 131 and extension 132, the body 131 is preferably exposed. The base 101 can be a grounding layer for the active device 110 to improve the electrical performance of the exposed pad module of the invention. The exposed base 101 can further transfer heat from the active device 110 to an external device such as a PCB (not shown) to further improve the heat dissipation capability of the exposed pad module of the invention.

Further, the encapsulant 170 may comprise a first encapsulant 171 and second encapsulant 172 when the exposed pad module of the invention is fabricated by a specific process. The first encapsulant 171 is above the base 101, covering the base 101, active device 110, and an upper side of the trace line 120 and passive device 150. The second encapsulant 172 is beneath the trace line 120 and passive device 150, and covers the trace line 120, passive device 150, and optionally the extension 132, thus completely encapsulating the trace line 120, passive device 150, and optionally the extension 132. The second encapsulant 172 exposes the base 101 and at least a part of the pad 130. The first encapsulant 171 and second encapsulant 172 are preferably of the same material to further improve the reliability of the exposed pad module of the invention.

The exposed base 101 and pad 130 are preferably approximately coplanar for connection to the described external device. Thus, the base 101 is preferably approximately as thick as the pad 130 for the coplanar arrangement thereof. The encapsulant 170 is preferably coplanar with the exposed base 101 and pad 130 to minimize the thickness of the exposed pad module of the invention.

Thus, the results show the efficacy of the inventive exposed pad module in integrating the passive device 150 therein, resulting in reduction of the total aspect compared to the conventional package and passive device, reducing the connection pace therebetween- to improve to electrical performance, capable of reduction of the wiring density and aspect of an external device, such as a PCB, subsequently connecting thereto to improve the entire electrical performance of an end product, thereby achieving the described objects of the invention.

Furthermore, the exposed pad module may further have wirings without the passive device 150. For example, a pad 140 in FIG. 1 is disposed beyond the base 101, and electrically connected to the active device 110 using the conductor 115. The pad 140 may further has a body 141 and extension 142 extending from the body 141 beyond the base 101. The conductor 115 preferably electrically connects the extension 142. The patterned solder mask 160 may further be disposed overlying the pad 140, exposing contact areas for connection to the conductor 115. The pad 140 is at least partially exposed by the encapsulant 170. When the pad 140 comprises the body 141 and extension 142, the body 142 is preferably exposed, and the extension 142 is thinner than the body 141 to simplify the encapsulation thereof. The exposed pad 140 is preferably coplanar with the exposed base 101 and pad 130 for connection to the described external device.

Figure 2:
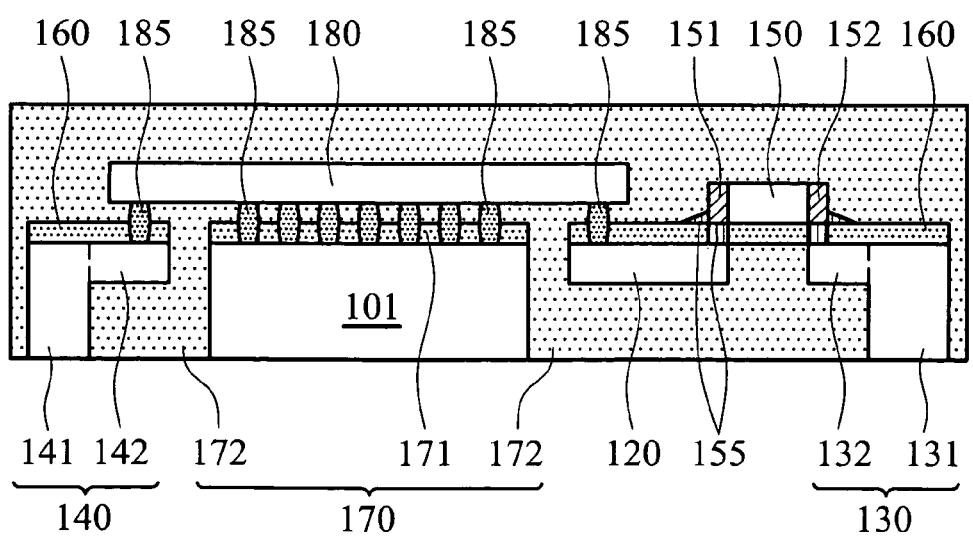
FIG. 2 is a cross-section of an exposed pad module of a second embodiment of the invention.

In FIG. 2, an exposed pad module of a second embodiment is shown, wherein the electrical connection between an active device 180 trace line 120 is different from that between the active device 110 and trace line 120 in the first embodiment.

The active device 180 can be a semiconductor chip, photoelectric device, or other device, and is a semiconductor chip in this embodiment. The electrical connection between the active device 180 and trace line 120 is achieved by flip chip technology. Conductive bumps act as conductors to electrically connect the active device 180 and trace line 120. The conductive bumps 185 also fix the active device 180 to trace line. The active device 180 is above the base 101. The active device may further connect to the base 101 using conductive bumps 185 to ground the active device 180 and/or transfer heat from the active device 180.

Details regarding the base 101, trace line 120, pad 130, body 131, extension part 132, passive device 150, terminals 151 and 152, solder 155, patterned solder mask 160, encapsulant 170, first encapsulant 171, second encapsulant 172, and dispositions of pad 140, body 141, and extension part 142 are the same as those described in the first embodiment, and thus, are omitted herefrom. When the exposed pad module further comprises pad 140, the active device may further be fixed and electrically connected to the pad 140 (further the extension part 142 when the pad comprises the body 141 and extension 142) using the conductive bumps 185 acting as conductors.

In FIGS. 3A through 3F, cross-sections of an example of fabrication procedures of the exposed pad module of the first embodiment of the invention are shown.

Figure 3A:
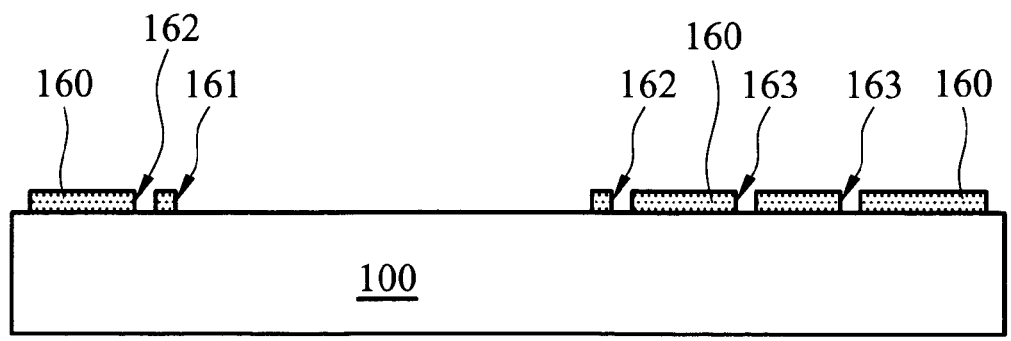
FIGS. 3A through 3F are cross-sections of a fabrication method of the exposed pad module of the first embodiment of the invention.

In FIG. 3A, first, a substrate 100, preferably a copper substrate, is provided. The substrate 100 may be coated thereon to prevent corrosion and/or facilitate soldering. A Ni/Au layer (not shown) is a preferred coating layer. A patterned solder mask 160, having openings 161, 162, and 163 respectively exposing contact areas for subsequent attachment of the active device 110, electrical connection between substrate 100 and active device 110, and electrical connection between substrate 100 and passive device 150, is preferably disposed overlying substrate 100. The openings 163 may further limit the position of glue layers during subsequent attachment steps for the active device 110 and passive device 150 to prevent flush of the glue layers.

Figure 3B:
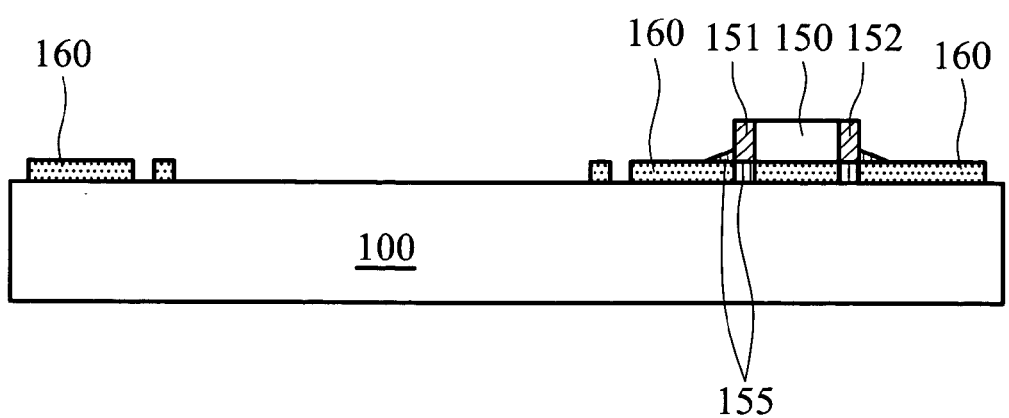

In FIG. 3B, solder 155, comprising a mixture including tin-based particles and flux, is formed in opening 163 (marked in FIG. 3A), followed by alignment of the passive device 150 and solder 155, and attaching the passive device 150 to substrate 100. The passive device 150 is preferably a SMT device, having terminals 151 and 152 respectively disposed on the solder 155, followed by a reflow step, during which the tin-based particles in solder 155 melts, cluster together, and connect substrate 100 and passive device 150, followed by solidification thereof. Thus, the passive device 150 fixed to and electrically connects substrate 100.

Figure 3C:
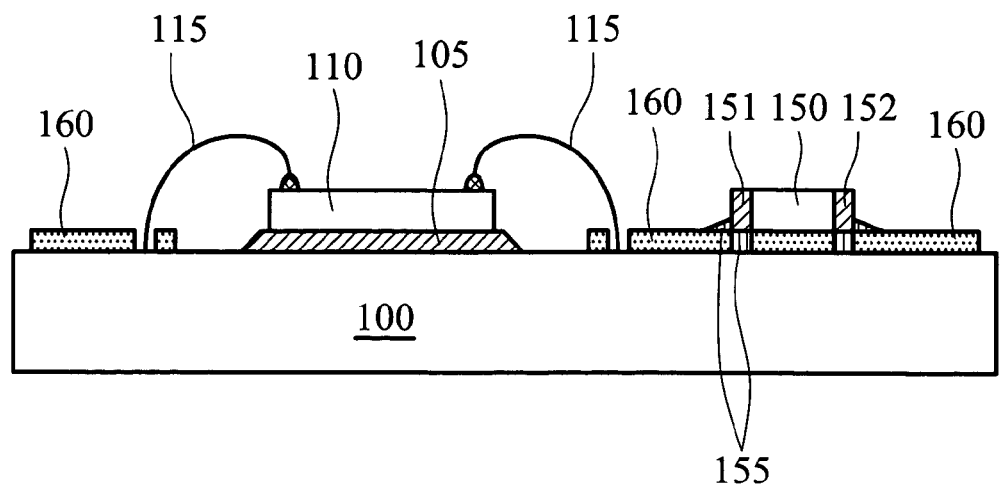

In FIG. 3C, a glue layer 105, such as a thermosetting epoxy with or without silver particles, is formed in opening 161 (marked in FIG. 3A), followed by attachment of the active device 100 such as a semiconductor chip thereto, and hardening of the glue layer. Thus, the active device 110 is fixed to substrate 100. Thereafter, a conductor, such as a gold wire or aluminum wire, is disposed between the active device 110 and exposed substrate 100 in opening 162 (marked in FIG. 3A), achieving the electrical connection between the substrate 100 and active device 110.

Figure 3D:
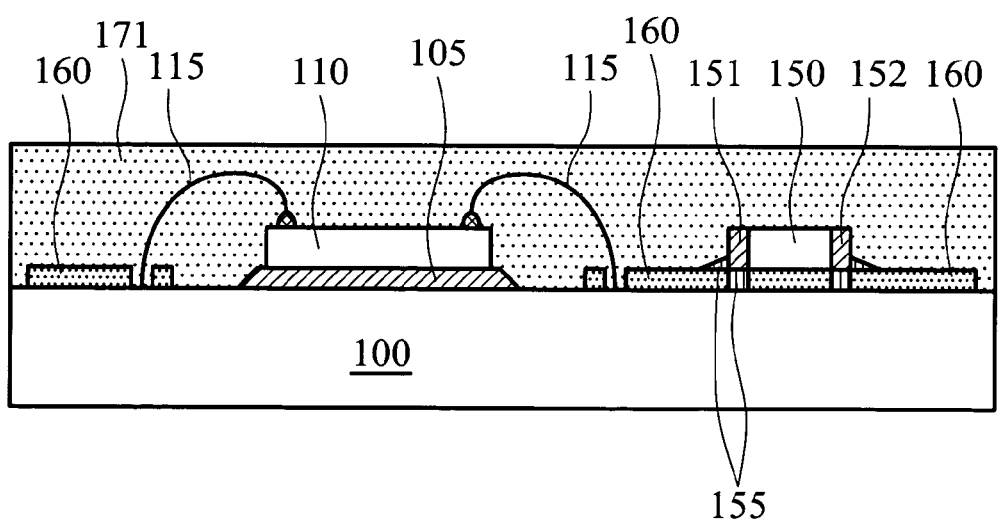

In FIG. 3D, a first encapsulant 171 is formed above the base 101, covering the base 101, active device 110, and an upper side of the trace line 120 and passive device 150, by a first molding step. The first encapsulant 171 is typically a mixture including a thermosetting resin and silica fillers. When the active device 110 is or includes a photoelectric device, the first encapsulant 171 may be transparent glass and/or transparent thermosetting resin.

Figure 3E:
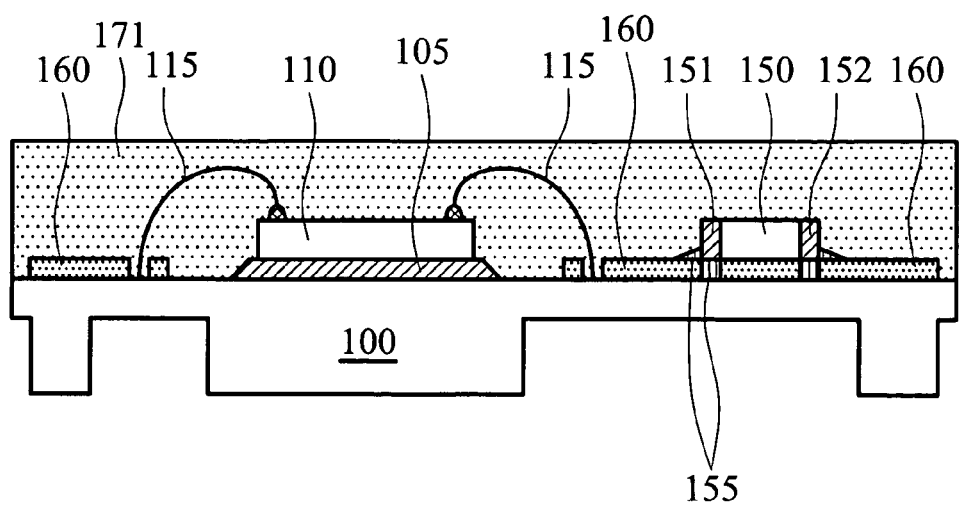

In FIG. 3E, the substrate 100 is etched during a first etching step. Initial profiles of exposed base 101, pad 130 and optionally the pad 140 of the module of the first embodiment of the invention are visible on the substrate 100 as shown in FIG. 1.

Figure 3F:
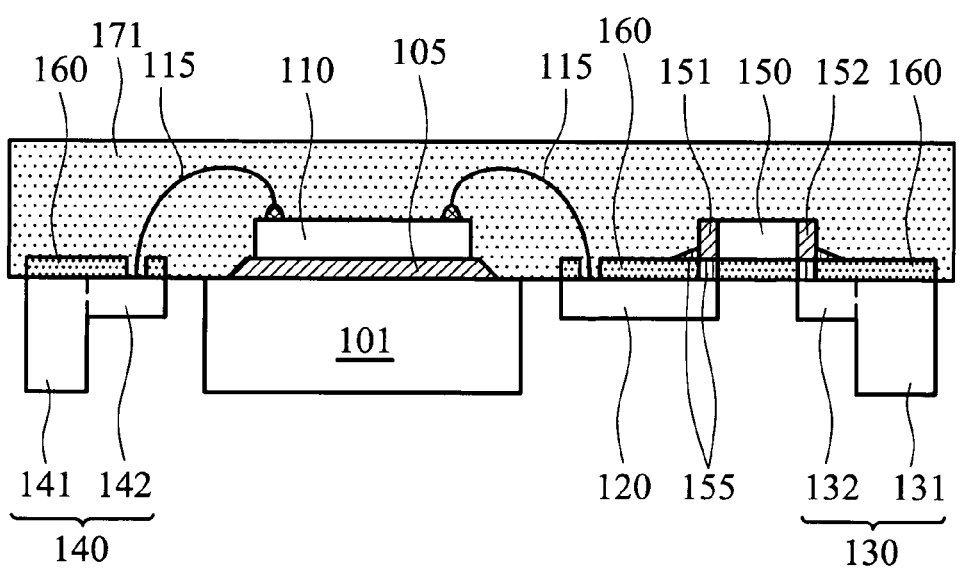

In FIG. 3F, the substrate 100 is etched and divided into a base 101, trace line 120, pad 130, and optionally the pad 140 during a second etching step. The pad 130 may further comprise a body 131 and extension 132. The optional pad 140 may further have a body 141 and extension 142.

Finally, a second encapsulant 172 is formed during a second molding step, achieving the exposed pad module of the first embodiment of the invention shown in FIG. 1. The second encapsulant 172 is beneath the trace line 120, passive device 150, and optionally the extensions 132 and 142, and covers the trace line 120, passive device 150, and optionally the extensions 132 and 142. Thus, the trace line 120, passive device 150, and optionally the extensions 132 and 142 are completely encapsulated. The second encapsulant 172 exposes the base 101 and at least part of the pad 130 and optionally the pad 140. The first encapsulant 171 and second encapsulant 172 are preferably approximately the same material to further improve reliability of the exposed pad module of the invention.

Figure 4A:
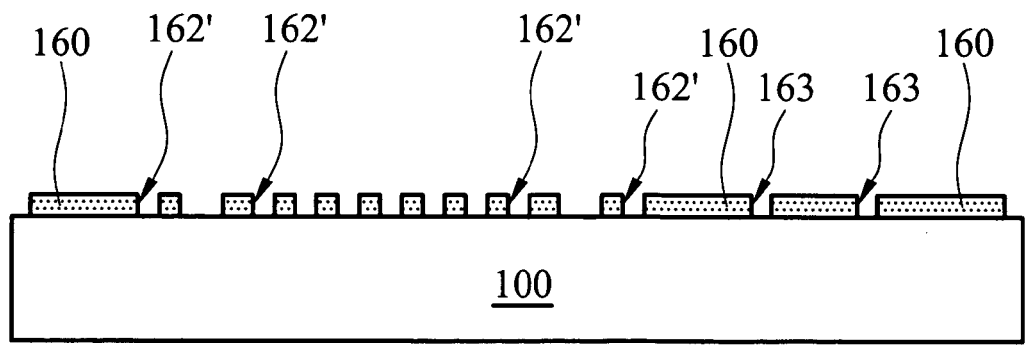
FIGS. 4A and 4B are cross-sections of a fabrication method of the exposed pad module of the second embodiment of the invention.
Figure 4B:
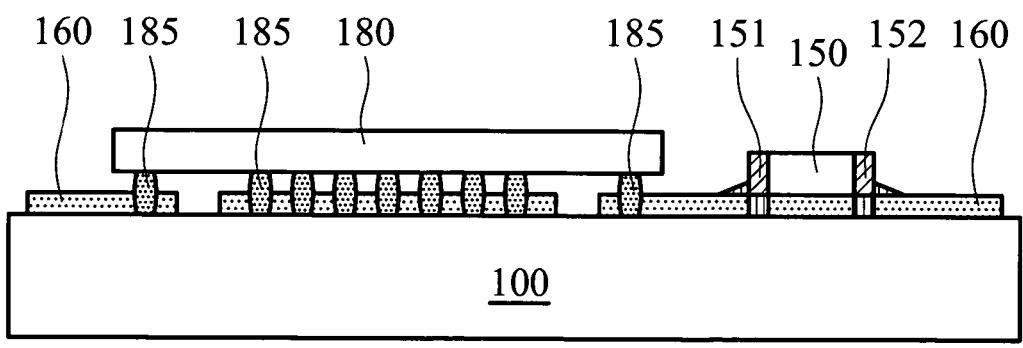

In FIGS. 4A and 4B, cross-sections of an example of fabrication procedures for the exposed pad module of the second embodiment of the invention are shown.

In FIG. 4A, first, a substrate 100, preferably a copper substrate, is provided. The substrate 100 may be coated thereon to prevent corrosion and/or facilitate soldering. A Ni/Au layer (not shown) is a preferred coating layer. A patterned solder mask 160, having openings 162' and 163 respectively exposing contact areas for subsequent connection between the substrate 100 and active device 180, and electrical connection between substrate 100 and passive device 150, is preferably disposed overlying substrate 100. The openings 162' and 163 may further limit the position of glue layers during subsequent attachment steps for the active device 180 and passive device 150 to prevent flush of the glue layers.

In FIG. 4B, the active device 180 and passive device 150 fix and electrically connect to the substrate 100. The connection between the active device 180 and substrate 100 is achieved by application of conductive bumps 185. The conductive bumps 185 can be previously formed on the active device 180 or in the openings 162' (marked in FIG. 4A), followed by application of a glue layer (not shown) to fix and connect the active device 180 to substrate 100.

Details regarding the step of fixing and electrically connecting the passive device and the subsequent packaging step to achieve the exposed pad module shown in FIG. 2 are the same as those described in FIGS. 3D through 3F, and thus, are omitted here.

While the invention has been described by way of example and in terms of preferred embodiment, it is to be understood that the invention is not limited thereto. It is therefore intended that the following claims be interpreted as covering all such alteration and modifications as fall within the true spirit and scope of the invention.

What is claimed is:

1. An exposed pad module, comprising:
   a base;
   an active device overlying the base;
   a trace line, thinner than the base, electrically connecting to the active device, beyond the base;
   a pad beyond the trace line;
   a passive device electrically connecting the trace line and pad; and
   an encapsulant covering the active device, trace line, and passive device, and exposing the base and at least a part of the pad.

2. The module as claimed in claim 1, wherein the pad further comprises:
   a body; and
   an extension, extending from the body, beyond the trace line.

3. The module as claimed in claim 2, wherein the passive device electrically connects the trace line and the extension.

4. The module as claimed in claim 2, wherein the extension is covered by the encapsulant.

5. The module as claimed in claim 1, wherein the passive device is between the trace line and pad.

6. The module as claimed in claim 1, wherein the base, trace line, and pad comprise copper.

7. The module as claimed in claim 1, wherein the exposed base and pad are approximately coplanar.

8. The module as claimed in claim 1, further comprising a patterned solder mask overlying the trace line and pad.

9. The module as claimed in claim 1, wherein the active device comprises a semiconductor chip.

10. The module as claimed in claim 1, further comprising a conductor electrically connecting the active device and trace line.

11. The module as claimed in claim 1, wherein the conductor comprises a gold wire, aluminum wire, or conductive bump.

12. The module as claimed in claim 1, wherein the passive device is of surface mount technology (SMT) type.

13. An exposed pad module, comprising:
    a base;
    an active device overlying the base;
    a trace line, thinner than the base, beyond the base;
    a conductor electrically connecting the active device and trace line;
    a pad, approximately as thick as the base, beyond the trace line;
    a SMT passive device between the trace line and pad, and electrically connecting the trace line and pad;
    a patterned solder mask overlying the trace line and pad;
    a first encapsulant, above the base, covering the active device, trace line and passive device;
    a second encapsulant, beneath the trace line and passive device, covering the trace line and passive device, and exposing the base and at least a part of the pad.

14. The module as claimed in claim 13, wherein the pad further comprises:
    a body; and
    an extension, thinner than and extending from the body, beyond the trace line.

15. The module as claimed in claim 14, wherein the passive device is between the trace line and extension, and electrically connects the trace line and extension.

16. The module as claimed in claim 14, wherein the second encapsulant is beneath the extension and covers the extension.

17. The module as claimed in claim 13, wherein the base, trace line, and pad comprise copper.

18. The module as claimed in claim 13, wherein the exposed base and pad are approximately coplanar.

19. The module as claimed in claim 13, wherein the active device comprises a semiconductor chip.

20. The module as claimed in claim 13, wherein the conductor comprises a gold wire, aluminum wire, or conductive bump.

21. An exposed pad module; comprising:
a base;
an active device overly the base;
a trace line, electrically connecting to the active device; beyond the base;
a pad beyond the trace line;
a passive device electrically connecting the trace line and pad;
a patterned solder mask overlying the trace line and pad; and
an encapsulant covering the active device, trace line, and passive device, and exposing the base and at least a part of the pad.

* * * * *